US012176205B2

(12) United States Patent
Zhou et al.

(10) Patent No.: US 12,176,205 B2
(45) Date of Patent: *Dec. 24, 2024

(54) METHOD AND CHAMBER FOR BACKSIDE PHYSICAL VAPOR DEPOSITION

(71) Applicant: Applied Materials, Inc., Santa Clara, CA (US)

(72) Inventors: Chunming Zhou, Fremont, CA (US); Jothilingam Ramalingam, Milpitas, CA (US); Yong Cao, San Jose, CA (US); Kevin Vincent Moraes, Mountain View, CA (US); Shane Lavan, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/337,319

(22) Filed: Jun. 19, 2023

(65) Prior Publication Data

US 2023/0335393 A1    Oct. 19, 2023

Related U.S. Application Data

(60) Continuation of application No. 17/902,357, filed on Sep. 2, 2022, which is a division of application No.
(Continued)

(51) Int. Cl.
*H01L 21/02*    (2006.01)
*H01L 21/677*   (2006.01)

(52) U.S. Cl.
CPC .. *H01L 21/02266* (2013.01); *H01L 21/67742* (2013.01); *H01L 21/67745* (2013.01)

(58) Field of Classification Search
CPC ......... H01L 21/02266; H01L 21/67742; H01L 21/67745; H01L 21/0217; H01L 21/302;
(Continued)

(56) References Cited

U.S. PATENT DOCUMENTS 5,439,574 A * 8/1995 Kobayashi .......... H01J 37/3405
                                                     204/192.15
6,593,254 B2   7/2003 Kraxenberger et al.
(Continued)

FOREIGN PATENT DOCUMENTS

JP    S62-18881 A    1/1987
JP    2010-037656 A  2/2010
(Continued)

OTHER PUBLICATIONS

International Sarch Report/ Written Opinion issued in PCT/US2020/02994 on Aug. 5, 2020.
(Continued)

*Primary Examiner* — Mohammed Shamsuzzaman
(74) *Attorney, Agent, or Firm* — Patterson + Sheridan, LLP

(57) ABSTRACT

Embodiments of the present disclosure generally relate to methods and apparatus for backside stress engineering of substrates to combat film stresses and bowing issues. In one embodiment, a method of depositing a film layer on a backside of a substrate is provided. The method includes flipping a substrate at a factory interface so that the backside of the substrate is facing up, and transferring the flipped substrate from the factory interface to a physical vapor deposition chamber to deposit a film layer on the backside of the substrate. In another embodiment, an apparatus for depositing a backside film layer on a backside of a substrate, which includes a substrate supporting surface configured to support the substrate at or near the periphery of the substrate supporting surface without contacting an active region on a front side of the substrate.

20 Claims, 7 Drawing Sheets

Related U.S. Application Data

16/847,455, filed on Apr. 13, 2020, now Pat. No. 11,469,096.

(60) Provisional application No. 62/843,201, filed on May 3, 2019.

(58) Field of Classification Search
CPC ......... H01L 21/67718; H01L 21/68707; H01L 21/67184; H01L 21/67167; C23C 14/042; C23C 14/0652; C23C 14/35; C23C 14/50; C23C 14/14; C23C 14/345; C23C 14/568; C23C 14/0036; C23C 14/0641; C23C 14/5806
See application file for complete search history.

(56) References Cited

U.S. PATENT DOCUMENTS

| | | | | |
|---|---|---|---|---|
| 6,620,298 | B1* | 9/2003 | Hayata | H01J 37/3405 |
| | | | | 204/298.18 |
| 7,169,685 | B2* | 1/2007 | Connell | H01L 23/562 |
| | | | | 438/464 |
| 9,881,788 | B2 | 1/2018 | Kim et al. | |
| 11,469,096 | B2* | 10/2022 | Zhou | H01L 21/67742 |
| 11,572,618 | B2* | 2/2023 | Ramalingam | H01J 37/32082 |
| 2007/0159065 | A1* | 7/2007 | Yan | C23C 14/35 |
| | | | | 313/503 |
| 2008/0093022 | A1* | 4/2008 | Yilmaz | H01L 21/67276 |
| | | | | 414/800 |
| 2008/0213664 | A1* | 9/2008 | Krasnov | H01M 4/139 |
| | | | | 429/220 |
| 2010/0221583 | A1* | 9/2010 | Foad | G11B 5/82 |
| | | | | 427/127 |
| 2015/0340225 | A1* | 11/2015 | Kim | C23C 16/455 |
| | | | | 118/728 |
| 2020/0350160 | A1* | 11/2020 | Zhou | H01L 21/68707 |
| 2021/0062325 | A1* | 3/2021 | Ramalingam | H01J 37/3405 |

FOREIGN PATENT DOCUMENTS

JP 2016-086005 A 5/2016
KR 10-2002-0034492 A 5/2002

OTHER PUBLICATIONS

Japanese Office Action dated Dec. 6, 2022 for Application 2021-564871.

JP Office Action dated Jul. 23, 2024 for Application No. 2023-116015.

* cited by examiner

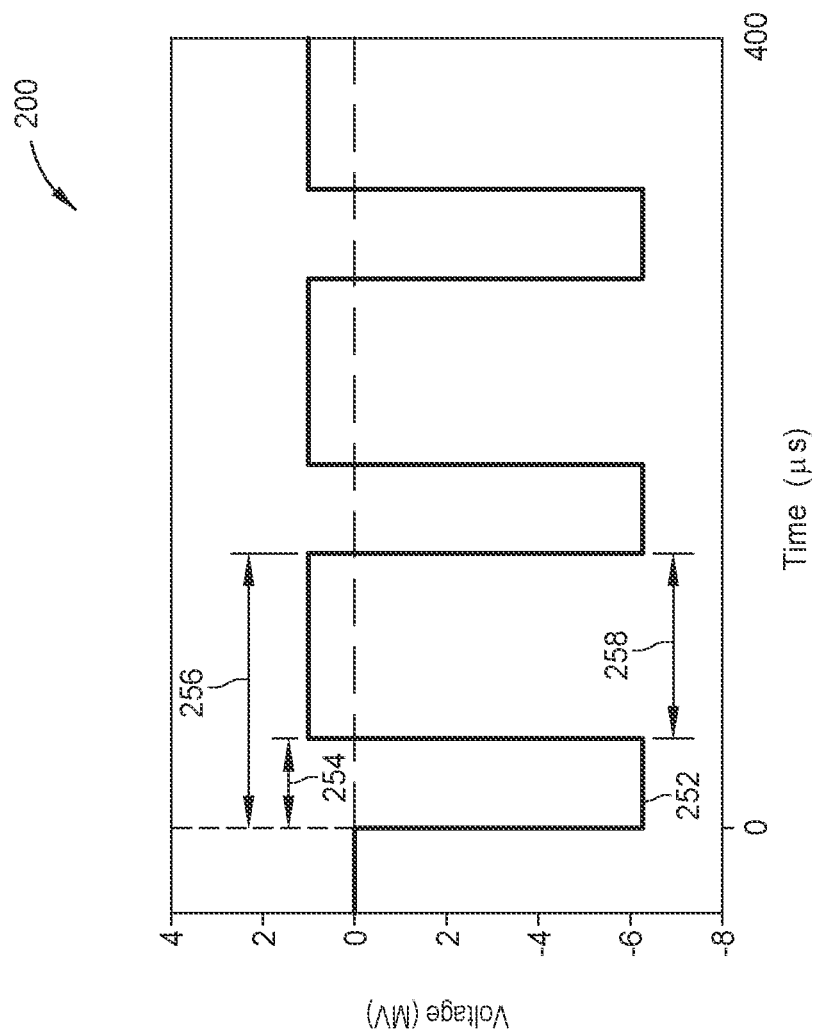

METHOD AND CHAMBER FOR BACKSIDE PHYSICAL VAPOR DEPOSITION

CROSS-REFERENCE TO RELATED APPLICATIONS

This application is a continuation application of U.S. patent application Ser. No. 17/902,357, filed Sep. 2, 2022, which is a divisional of U.S. patent application Ser. No. 16/847,455, filed Apr. 13, 2020, which claims priority to U.S. Provisional Patent Application No. 62/843,201, filed May 3, 2019, which are all hereby incorporated by reference in its entirety.

FIELD

Embodiments of the present disclosure generally relate to a method and an apparatus, and more specifically, to a method and a cluster tool for film layer deposition on the back of substrates.

BACKGROUND

As 3D NAND continues to scale in the vertical direction, the density of the elements/layers formed on integrated circuits is increasing. Various film stresses may be created between one layer and the next layer due to differences in thermal expansion, plasma non-uniformity distribution and/or plasma density during a plasma etching or plasma deposition processes. Such film stresses can result in localized deformation of the substrate surface and cause the substrate to fail to pattern due to excessive substrate bow. Bowing of the substrate also increases likelihood of misalignment between film layers deposited thereon in the subsequent manufacturing process. In addition, bowing of the substrate causes mistakes in lithography processes on the substrate, as the lithography design depends on the wafer being substantially flat.

One solution to the bowing issue is to also deposit a film on the backside of the substrate, which reduces strain on the backside of the substrate by matching the strains on films grown on the top side surface of the substrate, thus decreasing substrate bowing. Depositing film on the backside of the substrate requires either flipping the substrate, or depositing the film from underneath the substrate. Deposition from below requires additional sources located in a specially designed processing chamber, which may be prohibitive due to the cost and additional engineering required to build such a chamber. Flipping the substrate without damaging the already grown film requires either a protective layer grown on top of the deposited film, or a specialized flipping apparatus that does not damage or contact crucial areas of the top side film. One drawback of current backside deposition methods is that the backside film strain is reduced after the substrate undergoes an annealing process.

Therefore, there is a need for an apparatus and method that allows for flipping and growth of backside film on a substrate that maintains backside film strain after an annealing process.

SUMMARY

In one embodiment, a method of depositing a backside film layer on a substrate is provided, including loading the substrate into a factory interface of a cluster tool, the substrate having a front side and a backside, the front side having an active region, flipping the substrate at the factory interface so that the backside of the substrate is facing up, transferring the flipped substrate from the factory interface to a physical vapor deposition chamber, and depositing the backside film layer on the backside of the substrate. The backside film layer is deposited using a method including physical vapor deposition.

In another embodiment, a method of depositing a backside film layer a substrate is provided, including loading the substrate into a factory interface of a cluster tool, the substrate having a front side and a backside, the front side having an active region, flipping the substrate at the factory interface so that the backside of the substrate is facing up, transferring the flipped substrate from the factory interface to a physical vapor deposition chamber, and depositing the backside film layer on the backside of the substrate. The backside film layer is formed from sputtering from a sputter target, and the backside film layer is deposited by providing direct current (DC) power to the sputter target.

In another embodiment, a cluster tool for depositing a backside film layer on a substrate is provided, including a physical vapor deposition chamber having a chamber lid and one or more sidewalls, including a processing region bounded at least partially by the chamber lid and the one or more sidewalls, a sputter target having a first surface that is in contact with the processing region and a second surface that is opposite the first surface, a power source coupled to the sputter target, a substrate support having a substrate supporting surface facing the sputter target, the substrate support configured to support the substrate at or near the periphery of the substrate support without contacting an active region on a front side of the substrate, such that a backside of the substrate is exposed to the sputter target, a shadow mask disposed above the substrate support, the shadow mask defining a deposition area on the backside of the substrate, a gas conduit disposed in the sidewall of the physical vapor deposition chamber, and a magnetron disposed adjacent to the second surface of the sputter target. The magnetron includes an inner pole including an inner plurality of magnets, and an outer pole surrounding the inner pole, the outer pole including an outer plurality of magnets.

The growth of the backside film on the backside of the substrate reduces strain in the substrate caused by the film grown on the front side of the substrate. The film deposited by a physical vapor deposition (PVD) process allows for good control of strain engineering.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 2 is a graph of DC voltage pulses supplied to a magnetron.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to methods and apparatus for backside stress engineering of substrates to combat film stresses and bowing issues as outlined above. As discussed above, excessive stress on the front side of a substrate can cause the substrate to fail to pattern due to excessive substrate bow. Backside deposition has been observed to be able to compensate the stress and correct the substrate bow. Specifically, a film (e.g., silicon nitride (SiN)) is deposited on the backside of the substrate using physical vapor deposition (PVD) technique to counteract the stress from the front side deposition, thereby resulting in a neutral stress substrate that shows no bowing (or substantially no bowing). Details of various embodiments are further discussed below.

As used herein, the term "about" refers to a +/−10% variation from the nominal value. It is to be understood that such a variation can be included in any value provided herein.

Figure 1:
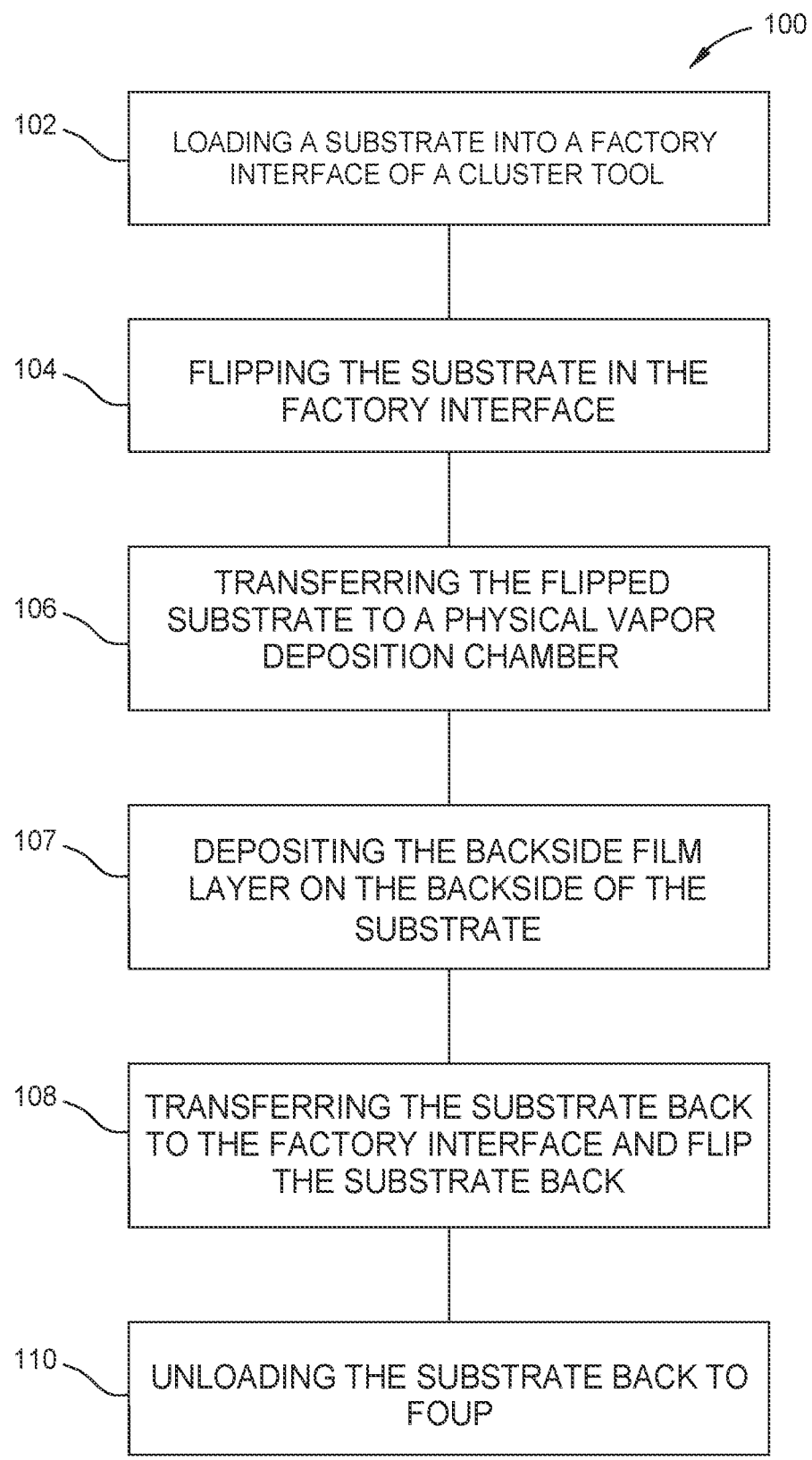
FIG. 1 illustrates a flow diagram of a method for depositing a film layer on a backside of a substrate, according to one embodiment.

FIG. 1 illustrates a flow diagram of a method 100 for depositing a backside film layer on a backside of a substrate, according to one embodiment. Although the method operations are described in conjunction with FIG. 1, persons skilled in the art will understand that any system configured to perform the method operations, in any order, falls within the scope of the embodiments described herein. The method 100 begins at operation 102 by loading the substrate to a factory interface (FI) of a cluster tool, such as the cluster tool 500 shown in FIG. 5. The substrate can be a material such as crystalline silicon (e.g., Si<100> or Si<111>), silicon oxide, strained silicon, silicon germanium, doped or undoped polysilicon, doped or undoped silicon wafers and patterned or non-patterned wafers, such as silicon on insulator (SOI), carbon doped silicon oxides, silicon nitride, germanium, gallium arsenide, glass, or sapphire wafers. The substrate can have one or more film stacks deposited on the front side. The film stacks can be utilized to form gate structures for three dimensional (3D) NAND semiconductor applications. A stack can include, but is not limited to, a stack with alternating oxide and nitride layers or a stack with alternating oxide and a silicon-containing layer (e.g., a polycrystalline silicon, an amorphous silicon layer, or a crystalline silicon).

At operation 104, the substrate is flipped over by a flipper that can be attached to, or disposed in the factory interface, or disposed in a processing chamber, according to some embodiments. In one embodiment, the substrate is flipped over at the factory interface so that the front surface of the substrate (e.g., a side where the majority of active region and/or integrated device is located) is facing down. The flipper has a substrate handler/carrier that can hold and flip the substrate through an edge contact approach. Therefore, the contact to the front side of the substrate is limited to an edge exclusion area of the substrate. No physical contact is made to the active region on the front side of the substrate, according to one embodiment. In various embodiments, the edge exclusion area is a radial distance of about 1 mm to about 5 mm, for example about 2 mm, measuring from the edge of the substrate.

At operation 106, the flipped substrate is transferred from the factory interface to a deposition chamber within the cluster tool by a substrate transport mechanism without contacting the front side active region. The substrate transfer mechanism can be the flipper as described above, or the substrate transfer mechanism can be a separate apparatus. The substrate transfer mechanism transfers the substrate by grabbing at or near its periphery (e.g., edge exclusion area). Since the substrate is flipped and transferred to the deposition chamber without contacting the front side active region, no protective layers are needed on the front side of the substrate before the backside film layer deposition. This eliminates the need for deposition strip processes necessary to produce the protective layers that are often used in conventional backside engineering to protect underlying device layers/structures on the front side from damages that can occur during backside deposition or any subsequent handling, transferring, chucking and/or de-chucking of the substrate.

Figure 4:
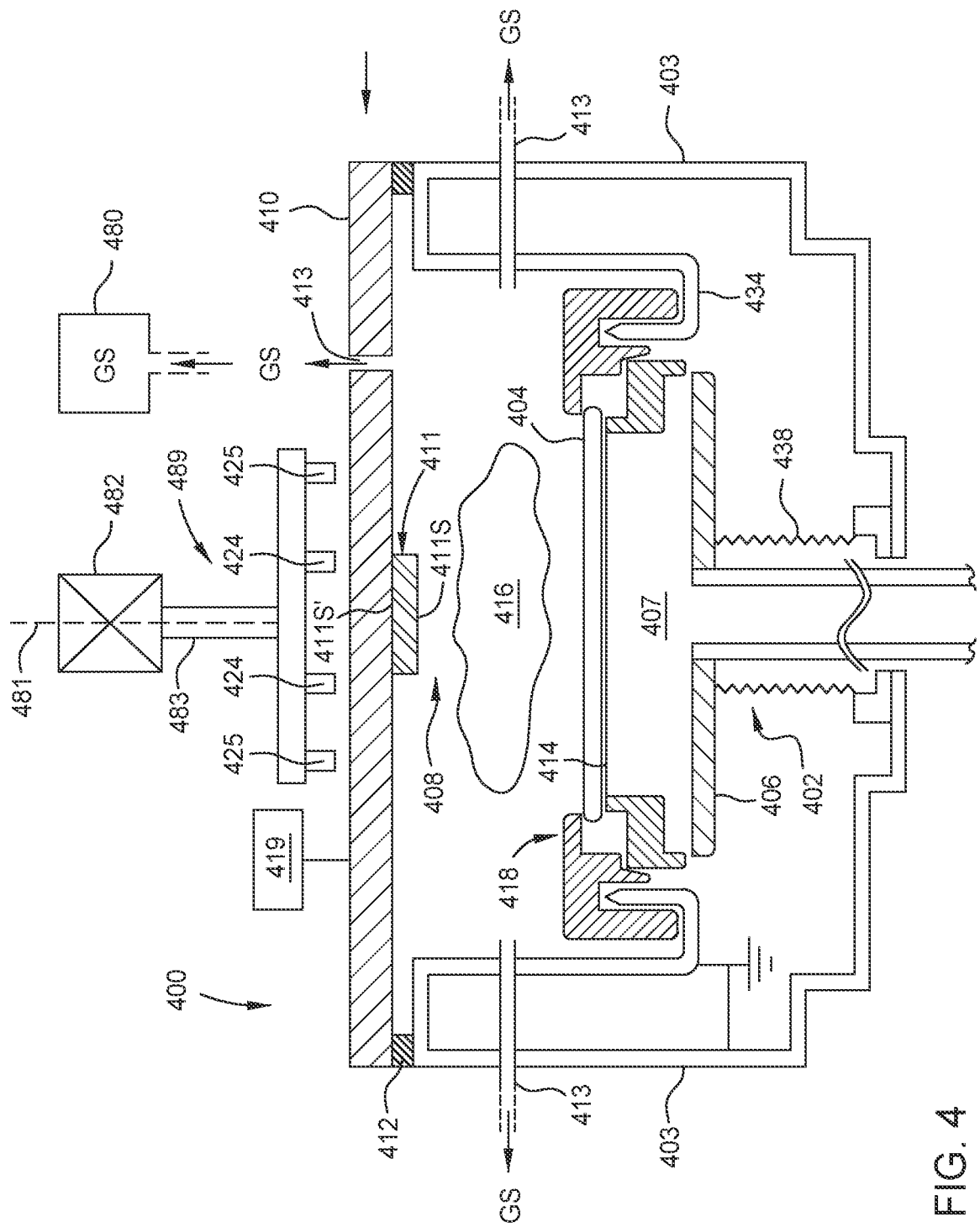
FIG. 4 illustrates a schematic cross-sectional view of a PVD chamber, according to one embodiment.

In one embodiment, the deposition chamber is a physical vapor deposition (PVD) chamber, such as the PVD chamber shown in FIG. 4. While PVD is discussed in this disclosure, various deposition techniques, such as chemical vapor deposition (CVD), plasma enhanced chemical vapor deposition (PECVD), atomic layer deposition (ALD), plasma enhanced atomic layer deposition (PEALD), low pressure chemical vapor deposition (LPCVD), etc., are also contemplated. The flipped substrate is disposed and secured onto a substrate support in the deposition chamber without contacting the front side active region. The substrate support can be an electrostatic chuck having a substrate supporting surface. Alternatively, the substrate support can be a ring structure so that the substrate is held by the ring structure at the periphery of the substrate. In any case, the front side of the substrate, when disposed on the substrate support, is facing down, while the backside of the substrate is facing up and exposed to a PVD source.

In addition, during the flipping of the substrate, as described in operation 106, no contact with active regions of the front side of the wafer is necessary. Also, no front side protection, using carbon deposition to protect active areas, or stripping of protective layers on the wafer, are necessary, reducing cost and easing use for the consumer.

At operation 107, the backside film layer is deposited on the backside of the substrate in the deposition chamber. The backside film layer can be a dielectric layer with compressive or tensile stress, depending on the stress profiles on the front side of the substrate. For example, if the film layers deposited on the front side are tensiley strained, the backside film layer should also be tensiley strained to balance out the overall stress, resulting in a substrate with substantially more neutral stress (e.g., reduced bowing). In one embodiment, the backside film layer includes silicon. As an example, growing a metal backside film layer, with a balanced magnetron and under high chamber pressure, results in a tensiley strained backside film. The metal backside film layer includes chromium (Cr), according to one embodiment. As another example, growing a backside film layer at high RF-applied substrate bias, low chamber pressure, and with an unbalanced magnetron results in a compressively strained backside film layer.

The as-deposited backside film layer shows radial symmetric local stress on the substrate. The as-deposited backside film layer can have about 1.5 GPa compressive stress, with high stress retention of about 60%, for example about 70%, post annealing. The backside film layer can have different thicknesses to compensate the stress profiles on the front side of the substrate. For example, the backside film layer can be deposited to a thickness at which the substrate bow becomes negligible (e.g., less than about 300 μm of bow, such as about 200 μm of bow). The deposition rate of the PVD process can be about 5 Å/s to about 25 Å/s, for example, about 20 Å/s. The backside film layer can have a thickness of about 0.1 μm to about 1 μm, for example, about 0.2 μm to about 0.5 μm. The thickness of the backside film layer discussed herein can be increased or decreased in accordance with the thickness of one or more layers deposited on the front side of the substrate.

During the backside film deposition process, the backside film layer can be deposited by coupling a radio frequency (RF) power source to a sputter target. The sputter target can include silicon. A plasma can be generated from a non-reactive gas such as argon (Ar), krypton (Kr), etc., or from a process gas including a nitrogen-containing gas (e.g., $N_2$) for nitride deposition, according to some embodiments. The non-reactive gas and any processing gas can be introduced into the deposition chamber via gas conduits disposed at the sidewall and/or top of the deposition chamber. A gas source is in fluid communication with the gas conduits, such that the gas source supplies the process gas to the sputter target, according to one embodiment. Once the plasma is formed, the sputtering plasma is delivered to the sputter target to form an ionized species, the ionized species forming a silicon-containing layer (e.g., SiN) on the backside of the substrate. The RF power can be applied to the sputter target at a power level of about 300 W to about 800 W, such as about 500 W, according to one embodiment.

The frequency of the RF power can be in a range of about 10 MHz to about 30 MHz, for example, about 13.56 MHz. The deposition chamber can be maintained at a pressure of about 1.5 mTorr to about 10 Torr, for example, about 2.5 mTorr to about 1 Torr. A high-stress backside film layer can be achieved by increasing the sputter target sputtering rate and sputter ionization fraction. For example, the PVD deposition chamber can use an unbalanced magnetron (e.g., magnetron 489 shown in FIG. 4) to project a magnetic field into the processing region towards the substrate support. Such an unbalanced magnetron is disposed on or adjacent to the back of the sputter target and can include an inner pole and an outer pole. The inner pole includes a plurality of inner magnets of one magnetic polarity, and the outer pole includes a plurality of outer magnets of opposite magnetic polarity. The outer pole surrounds the inner pole, according to one embodiment. The magnetic field creates a high-density plasma region adjacent the front surface of the sputter target, which greatly increases the sputtering rate. The magnetron is unbalanced in the sense that the ratio of the magnetic field strength of the inner pole to the magnetic field strength of the outer pole is 0.5 or more, such as about 0.55 to 0.73, according to one embodiment. However, a different ratio is also contemplated, depending on the application.

Additionally or alternatively, a direct current (DC) power source can be coupled to the sputter target to ignite and maintain the plasma of the processing gas (e.g., inert gas or a nitrogen-containing gas for nitride deposition), according to some embodiments. The processing gas is energized to ignite a plasma producing positive ions that are accelerated to the sputter target (e.g., silicon sputter target) and sputter the sputter target material. The power of the supplied DC can be from about 50 W to about 10000 W, such as about 100 W to about 5000 W. In cases where radio frequency (RF) power and the DC power are used, a ratio of applied RF power to applied DC power can be about 2:1 to about 8:1, for example, about 4:1 to about 6:1, according to some embodiments.

In some embodiments, the sputter target can be biased with pulsed DC power to tune the stress level of the backside film layer. In such a case, a high power impulse magnetron sputtering process can be performed to ignite and maintain the plasma which provides for sputtering and etching phases of the waveform. Pulsed DC is known to be more effective for dielectric sputtering targets.

FIG. 2 is a graph 200 of DC voltage pulses supplied to a magnetron. The DC power is delivered at high voltages over short durations to generate a high density and energy plasma during the high power impulse magnetron sputtering process. High voltages can be in the range of about 2000 V to about 60000 V. The power impulse 252 (or energy pulse) can be generated by the DC power source with a time duration 254 (or pulse width) and a pulse cycle time 256. The time duration 254 of each power impulse 252 can be between about 10 μs and about 40 μs, with a pulse cycle time 256 of about 200 μs, which corresponds to a pulse repetition frequency of 5000 Hz, i.e. an interval between sequential pulses of about 160 μs to about 190 μs. While a square waveform is shown, the power or energy delivered over the pulse cycle time 256 can have a non-square waveform (not shown) during time duration 254, and thus the average power over the time duration 254 can be at a value between about 1 kW and about 100 kW, such as between about 10 kW and about 40 kW. The pulse can have a sine, triangle, or sawtooth waveform. In some embodiments, each power impulse 252 provided to the sputter target can have equal amounts of power and/or equal durations. If desired, each power impulse 252 provided to the sputter target can have a different amount of power and/or a different duration. It has been found that the sputtered material can have a high amount of reactive energy and a high degree of ionization when high power impulses 252 are applied to the sputter target, which leads to denser coatings and a more rapid coating process.

Certain deposition parameters can also be tuned to produce a backside film layer with a desired stress level. In some embodiments, which can be combined with any of the embodiments of this disclosure, an RF bias can be applied to the substrate support to promote formation of a highly stressed backside film layer. In such a case, an air gap, which can be about 1 mm, can be maintained between the substrate and the substrate supporting surface of the substrate support to couple to an RF bias. Alternatively, the RF bias can be connected to the substrate support, which is conductive and acts as an electrode, through a capacitive coupling circuit. In the presence of a plasma, the RF biased substrate support can attract and accelerate positive ions in the plasma to promote bombardment of the ions on the backside of the substrate. In any case, the RF bias can have a power level within a range from about 100 W to about 600 W, for example about 200 W to about 400 W. The RF bias controls re-sputtering to optimize coverage of the deposited backside film layer. The RF bias also helps to control bombardment of the ions on the backside of the substrate, thereby affecting the backside film properties such as film density. The frequency of the RF bias can be about 356 kHz to about 60 MHz. The RF bias increases the stress of the deposited backside film. The RF bias attracts more charged particles from the plasma 416 than without the RF bias. It is contemplated that the substrate can also be electrically floating and have no RF bias, depending on the application.

Other deposition parameters that can be used to control stress level of the backside film layer include, but are not limited to, the exposure time of the PVD source, temperature of the substrate, pressure within the deposition chamber, etc. In some embodiments, the substrate can be heated by the substrate support and/or one or more lamps, which can be disposed at the top and/or bottom of the deposition chamber. In such a case, the temperature of the substrate can be maintained at a range of about 10° C. to about 600° C., for example, about 30° C. to about 400° C. In some embodiments, the substrate is maintained at about 350° C. or below during the PVD process.

In some embodiments, which can be combined with any of the embodiments of this disclosure, the substrate can be subjected to a post annealing process to further tune the stress level of the backside film layer. For example, the substrate can be subjected to an anneal process by heating the substrate to a temperature of about 650° C. or above, for example about 750° C. to about 950° C., for about 1 minute to about 180 minutes, for example, about 3 minutes to about 15 minutes. In one example, the substrate is heated to a temperature of about 650° C. for about 180 minutes. In another example, the substrate is heated to a temperature of about 850° C. for about 3 minutes. If desired, the backside film layer can be subjected to photolithography before the annealing. The annealing and deposition process can be repeated multiple times.

Figure 3A:
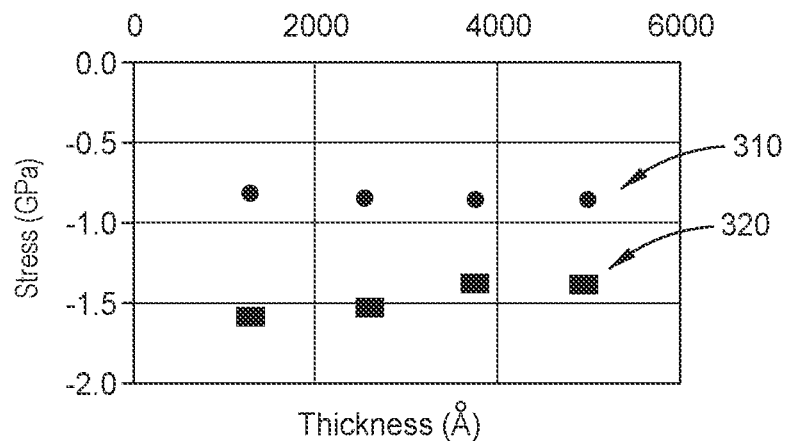
FIG. 3A is a graph of the stress of a physical vapor deposition (PVD) silicon nitride (SiN) backside film layer plotted as a function of the thickness of the SiN backside film layer before and after an annealing process.

FIG. 3A is a graph of the stress of a PVD SiN backside film layer plotted as a function of the thickness of the SiN backside film layer before 310 and after 320 the annealing process (850° C. for 15 minutes). As can be seen, the film stress of the SiN backside film layer is improved after the annealing process. In addition, the stress is comparable post annealing with a thinner (~1000 Å) film layer.

Figure 3B:
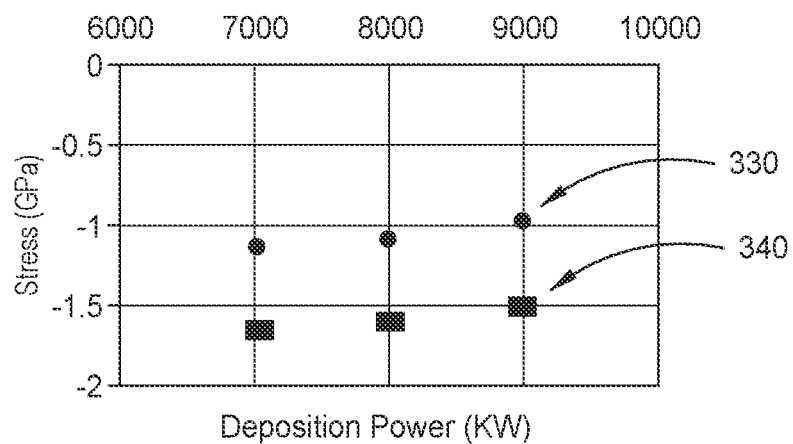
FIG. 3B is a graph of the stress of a PVD SiN backside film layer plotted as a function of the deposition power applied to the target before and after annealing process.

FIG. 3B is a graph of the stress of a PVD SiN backside film layer plotted as a function of the deposition power applied to the sputter target before 330 and after 340 annealing process (850° C. for 15 minutes). As can be seen, the high power deposition has minor impact on the stress. For example, the PVD SiN backside film layer has a compressive stress of 0.96 GPa at high power of 9 kW deposition (deposition rate 20 Å/s) post annealing. In addition, the PVD SiN backside film layer can achieve about 64% retention of the pre annealing stress after post annealing.

Figure 3C:
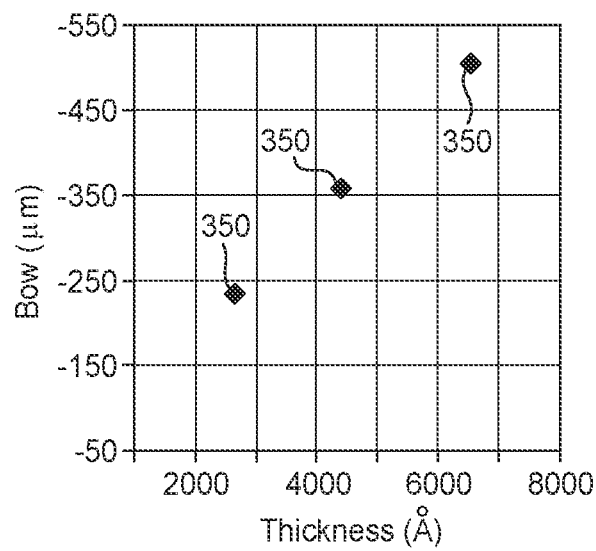
FIG. 3C is a graph of the bowing of a substrate plotted as a function of the thickness of the backside film layer.

FIG. 3C is a graph of the bowing of a substrate 350 plotted as a function of the thickness of the backside film layer. An increase in thickness of the backside film layer leads to a larger reduction of the bowing (the bowing becomes more negative, i.e., the bowing is reduced).

Using PVD may lead to several advantages over other deposition methods. For example, the as-deposited SiN backside film layer has two times higher stress retention (~60-70%) than the backside film layer deposited by a CVD technique. The number of passes needed for backside film deposition can be minimized due to high stress retention (thermal stability) of the PVD-deposited backside film. The backside film layer deposited by PVD can provide radial uniform local stress without in-plane distortion (IPD) or local surface curvature (LSC), which would otherwise occur if the backside film layer were deposited by a CVD method. A thinner PVD-deposited backside film is needed to correct a 200 μm bow in the substrate than is needed from a CVD-deposited backside film.

At operation 108, the substrate having the PVD deposited backside film layer is transferred from the deposition chamber back to the factory interface by the substrate support. The substrate is transferred without contacting the front side active region. The substrate support is configured to receive the substrate form the factory interface, according to one embodiment. The substrate is then flipped again at the factory interface so that the backside film layer is facing down.

At operation 110, the substrate having the PVD deposited backside film layer is unloaded to a front opening unified pod (FOUP) that is coupled to the factory interface. Alternatively, the substrate having the PVD deposited backside film layer can be transferred to one or more process chambers within the cluster tool for further processing.

FIG. 4 depicts a schematic cross-sectional view of a PVD chamber 400, according to one embodiment. The PVD chamber 400 generally includes a chamber lid 410 and sidewalls 403 that define a processing region 408 therein. A substrate support 402, which can be an electrostatic chuck, is positioned within the processing region 408. The processing region 408 is typically maintained at a pressure within a range of about 1 mTorr to about 20 Torr by a vacuum pump (not shown), such as about 3 mTorr to about 10 mTorr. The substrate support 402 includes a pedestal 406 and a susceptor 407. The substrate support 402 is configured to receive a substrate 404 from the factory interface 503 (FIG. 5), according to one embodiment. The susceptor 407 has a substrate supporting surface 414 that supports the substrate 404, which is positioned in an upside down direction (i.e., the backside of the substrate is facing the chamber lid 410) according to embodiments of the present disclosure. The substrate supporting surface 414 is configured to support the substrate 404 at or near the periphery of the substrate supporting surface without contacting an active region on the front side of the substrate, such that the backside of the substrate is exposed to a sputter target 411. The substrate supporting surface 414 can include a support ring, support fins, or lift pins, which are placed such that the active regions of the substrate 404 is not contacted.

The pedestal 406 is connected to a lift mechanism 438 or other actuator disposed through the bottom of the PVD chamber 400. The chamber lid 410 is disposed at the top of the PVD chamber 400. The chamber lid 410 includes one or more sputter targets 411. The chamber lid 410 contains sputter target material, according to one embodiment. The one or more sputter targets 411 are built in to the chamber lid 410, according to one embodiment. The sputter target 411 has a first surface 411S that is in contact with a processing region 408, and a second surface 411S' disposed opposite to the first surface. The PVD chamber 400 can include metrology tools (not shown), such as x-ray diffraction (XRD), ellipsometry, nanotopography, WaferSight™, pattern wafer geometry (PWG), dual-Fizeau interferometry, or laser metrology tools, in order to measure wafer characteristics such as lattice constants, strain, stress, substrate bowing, IPD, and LSC.

A magnetron 489 can be disposed adjacent to the chamber lid 410 and rotate about the central axis 481 of the chamber lid 410 by a magnetron actuator 482. The magnetron actuator 482 is coupled to the magnetron 489 by a magnetron shaft 483. The magnetron 489 is disposed adjacent to the second surface 411S' of the sputter target 411. The magnetron 489 can have an unbalanced magnet configuration. For example, the magnetron 489 can include an inner pole 424 including a plurality of magnets of one magnetic polarity, and an outer pole 425 including a plurality of magnets which surround the inner pole 424 and have the opposite magnetic polarity. The inner pole 424 and outer pole 425 can form a closed-loop magnetron assembly. The inner pole 424 creates an inner magnetic field, the outer pole 425 creates an outer magnetic field, and the ratio of the magnetic field strength of the inner magnetic field to the magnetic field strength of the outer magnetic field is between about 0.2 to about 3, for example, about 0.5 to about 1.6. The unbalanced magnet configuration increases the magnetic field strength at certain portions of the magnetron 489, which creates more charged particles in the created plasma 416. It is contemplated that the ratio can be adjusted to change the sputtering rate, as discussed above.

The sputter target 411 material can contain silicon, dielectric material, or metal, according to some embodiments. The sputter target provides a sputtering surface positioned to deposit sputtered material onto a top surface of the substrate 404. The chamber lid 410 can be negatively biased by a power source 419 to form a cathode. The chamber lid 410 is electrically insulated from the remainder of the PVD chamber 400 by an insulator ring 412. The insulator ring 412 electrically isolates the chamber lid 410 from a grounded annular shield member 434, so that a negative voltage can be maintained on the sputter target. The annular shield member 434 at least partially encloses a portion of the processing region 408 and is electrically coupled to a ground. For nitride deposition, a nitrogen-containing gas (e.g., $N_2$) and an optional inert gas (e.g., Ar or He) can be provided to the PVD chamber 400 to react with the sputtered target material, which is silicon in one example. The power source 419 applies a negative voltage to the sputter target in the chamber lid 410 with respect to the grounded annular shield member 434, thereby exciting the nitrogen-containing (and inert gas, if added) into a plasma 416. Ions from the plasma bombard the sputter target surface and sputter target material from the sputter target. The power source 419 can be any type of power source, including DC, pulsed DC, RF, alternating current (AC), and any combinations thereof. The power source 419 can be configured to perform a high power impulse magnetron sputtering process, as discussed above. The DC power source is configured to deliver pulsed DC power at a voltage of about 2000 V to about 60000 V, a time duration of about 10 μs and about 40 μs, and a pulse cycle time of about 200 μs, according to one embodiment.

The sputter target 411 can include silicon. The plasma 416 can be generated from a non-reactive gas such as argon (Ar), krypton (Kr), etc., or from a process gas including a nitrogen-containing gas (e.g., $N_2$) for nitride deposition, according to some embodiments. The non-reactive gas and any processing gas can be introduced into the deposition chamber via gas conduits 413 disposed in the sidewall 403 and/or top of the PVD chamber 400, such as in the chamber lid 410. A gas source 480 is in fluid communication with the gas conduits 413, such that the gas source supplies the process gas to the sputter target 411, according to one embodiment. Once the plasma 416 is formed, the sputtering plasma is delivered to the sputter target 411 to form an ionized species, the ionized species forming a silicon-containing layer (e.g., SiN) on the backside of the substrate 404. The RF power can be applied to the sputter target 411 at a power level of about 300 W to about 800 W, such as about 500 W, according to one embodiment.

The PVD chamber 400 includes a shadow mask 418 that defines target deposition area on the backside of the substrate 404. The shadow mask 418 can also prevent deposition from occurring in unwanted locations, such as bevel and/or the active region on the front side of the substrate 404. Therefore, no additional bevel clean is required. The shadow mask 418 can have different size options to protect the bevel area of the substrate from deposition. The bevel area can be from between about 1 mm to about 2 mm measured from the edge of the substrate 404.

Figure 5:
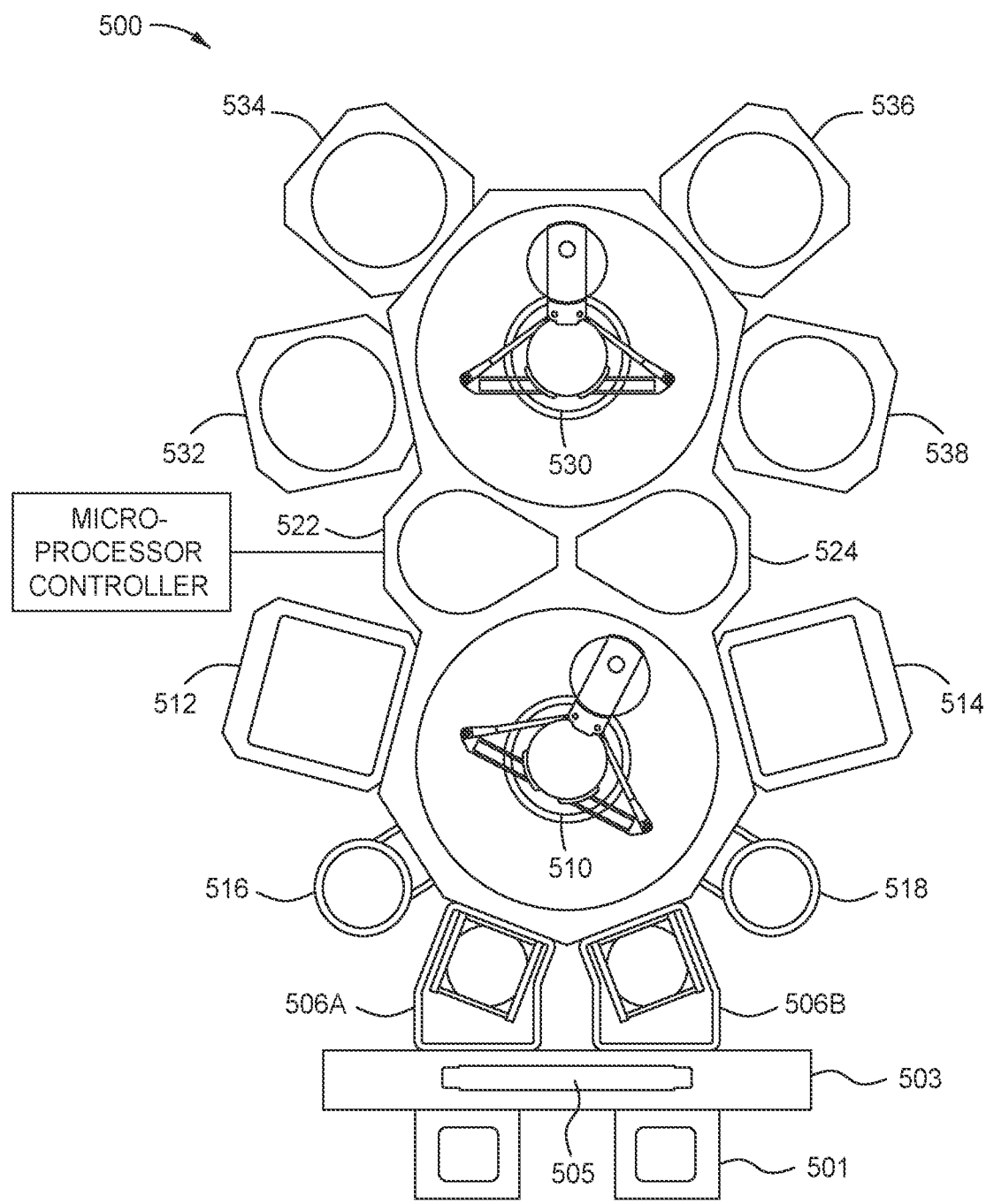
FIG. 5 illustrates a cluster tool, according to one embodiment.

The PVD chamber 400 can be part of a cluster tool. FIG. 5 illustrates a cluster tool 500, according to one embodiment. The cluster tool 500 features at least one PVD chamber 400, as described above. An example of the cluster tool 500 is the Endura® system available from Applied Materials, Inc., of Santa Clara, California. Cluster tools manufactured by others can be used as well.

The cluster tool 500 includes a factory interface (FI) 503 attached to the cluster tool 500. The FI 503 includes one or more front opening unified pod (FOUPs) 501 for handling and transporting substrates from one area of a semiconductor fab to another area. The FI 503 removes substrates from the FOUPs 501 and flips the substrates as discussed above using a flipper 505 disposed in, or attached to the FI 503, according to one embodiment. The flipper 505 can also be disposed in the PVD chamber 400. A side of the FI 503 is attached to load lock chambers 506A, 506B, which transfer substrates between the FI 503 and various process chambers of the cluster tool 500. A first robot 510 can transfer the substrates between the load lock chambers 506A, 506B, and a first set of one or more process chambers 512, 514, 516, 518 (four are shown). Each process chamber 512, 514, 516, 518, can be outfitted to perform a number of substrate processing operations including the PVD processes described herein and etch process, cyclical layer deposition (CLD), atomic layer deposition (ALD), chemical vapor deposition (CVD), pre-clean, degas, orientation and other substrate processes.

The first robot 510 can also transfer substrates to/from one or more intermediate transfer chambers 522, 524. The intermediate transfer chambers 522, 524 can be used to maintain ultrahigh vacuum conditions while allowing substrates to be transferred within the cluster tool 500. A second robot 530 can transfer the substrates between the intermediate transfer chambers 522, 524 and a second set of one or more process chambers 532, 534, 536, 538. The process chambers 532, 534, 536, 538 can be outfitted to perform a variety of substrate processing operations similar to process chambers 512, 514, 516, 518. Any of the process chambers 512, 514, 516, 518, 532, 534, 536, 538 can be removed from the cluster tool 500 if not necessary for a particular process to be performed by the cluster tool 500.

An illustrative multi-processing cluster tool 500 can include up to four process chambers 532, 534, 536, 538 similarly configured to the PVD chamber 400 described above. For example, the process chamber 512 can be a PVD chamber configured to deposit a backside film layer (e.g., SiN) on the backside of the substrate.

The cluster tool 500 can be used to perform the methods described in FIG. 1 above. For example, the substrate is flipped at the FI 503 to position the substrate with its front surface (the surface having an active region and/or integrated device) facing down. The substrate is then transferred by the first robot 510 to the process chamber 512 where a backside film layer is deposited on the backside of the substrate. The substrate having the deposited backside film layer can be transferred back to the FI 503 where the substrate is flipped again so that the front surface is facing up. The substrate can then be transferred to any of the process chambers 514, 516, 518, 532, 534, 536, 538 for further processing, or unloaded to the FOUP 501.

Figure 6:
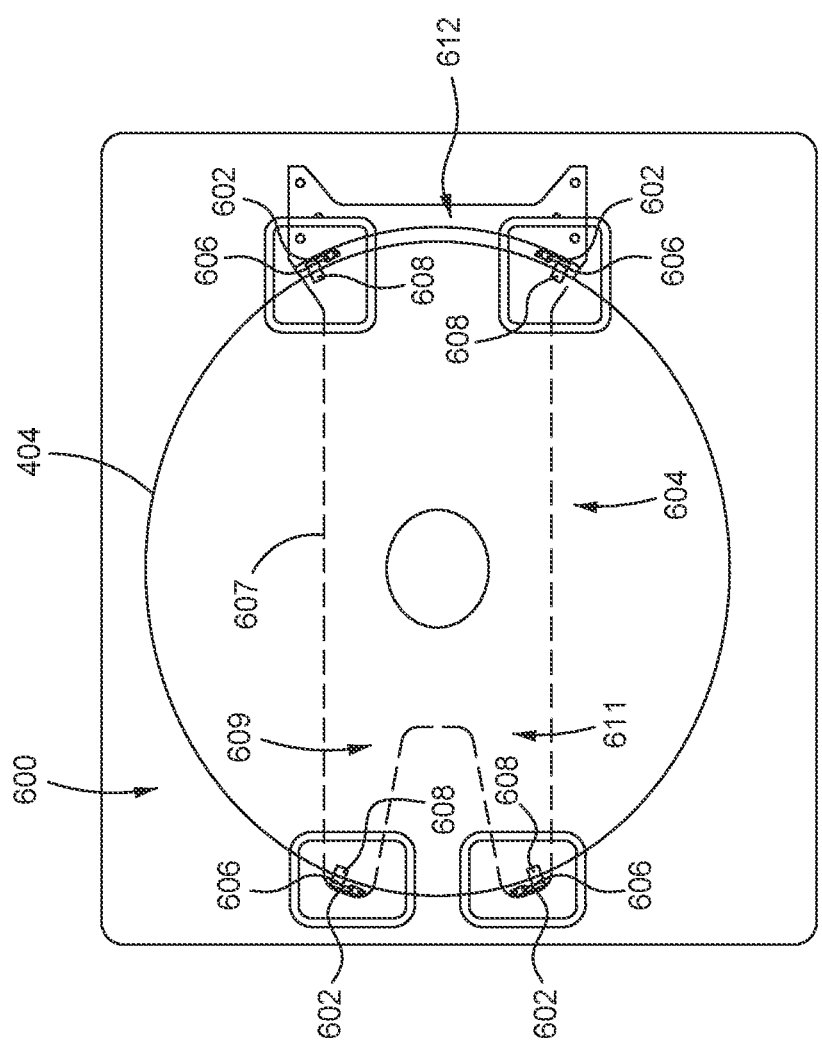
FIG. 6 illustrates a substrate transfer apparatus, according to one embodiment.

FIG. 6 illustrates a substrate transfer apparatus 600, according to one embodiment. The substrate 404 is disposed on the substrate transfer apparatus 600. Although the substrate 404 is shown as transparent for ease of describing FIG. 6, the substrate can be transparent or opaque, depending on the substrate composition and film composition thereon, and is therefore not limiting the optical properties of the substrate. The flipper 604 can have a blade 607 and two fork-like arms 609, 611 extending from the blade 607. A clamping spring 602 can be disposed at distal ends of the arms 609, 611 and work with a vertical wall 606 to help secure the substrate. The clamping spring 602 can be attached to a contact pad 608. The height of the contact pad 608 can be increased to avoid blade-substrate front contact. In addition, the blade 607 can have a soft touch edge contact to minimize defects, scratches, and abrasions to the substrates. The vertical wall 606 of the blade 607 defines a substrate pocket 612 to confine the movement of the substrate. In some embodiments, the substrate transfer apparatus 600 is disposed in the PVD chamber 400, rather than the FI 503.

Figure 7:
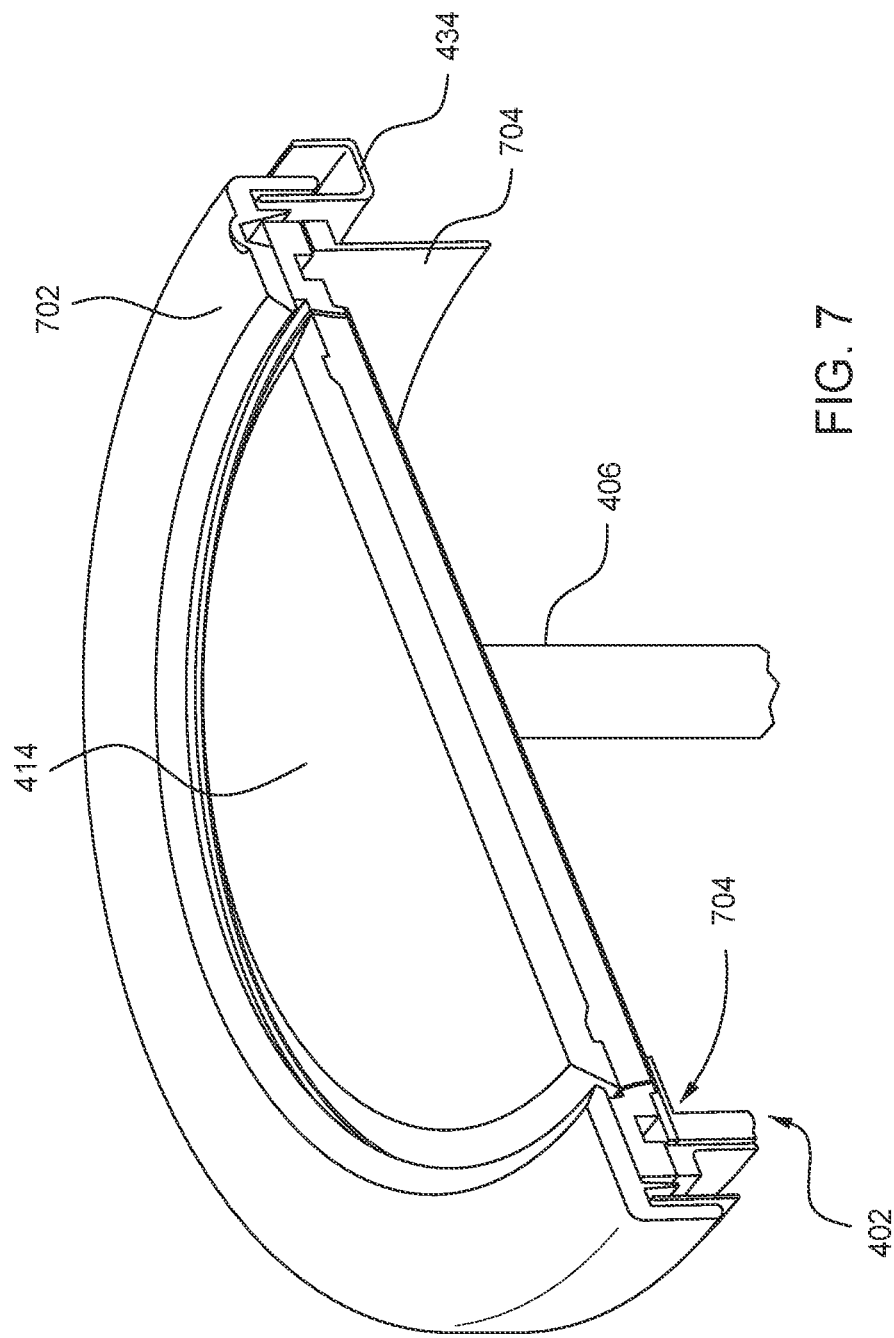
FIG. 7 is a perspective view of a portion of a substrate support, according to one embodiment.

FIG. 7 is a perspective view of a portion of the substrate support 402, according to one embodiment. A shadow mask 702 can be used to replace the shadow mask 418 shown in FIG. 4. As can be seen, the shadow mask 702 is supported by an annular shield member 434 and a process shield 704, which is configured to surround the substrate support 402. The shadow mask 702 is a ring-shaped structure disposed radially outward of the substrate support 402. The shadow mask 702 defines a deposition region (i.e., target area) on the backside of the substrate (not shown) such that only the target area is exposed to PVD source for deposition of the backside film layer. Particularly, the shadow mask 702 allows the backside film layer to be deposited on the backside of the substrate without depositing on bevel and the active region on the front side of the substrate. This eliminates the need for bevel etching or cleaning, reducing cost to the consumer.

The shadow mask 702 can have different designs (e.g., different shapes or sizes) and is configured to be exchangeable. In some embodiments, a non-circular shadow mask 702 can be used to compensate for different stress profiles on the front side of the substrate. The shadow mask 702 can have different designs, depending on the desired stress profile of the backside film. The shadow mask 702 is movable such that the gap between the shadow mask and the substrate 404 is adjustable to achieve a profiled deposition, thereby compensating for different stress profiles on the front side of the substrate. Different design of a shadow mask 702 can also be used to provide tenability to compensate non-concentric stress profiles. The shadow mask 702 also allows for selective PVD backside film growth, which is useful for rectification of local strain. For example, if the substrate 404 has a large strain mismatch in a specific portion, a shadow mask 702 can be designed such that only that portion of the backside of the substrate is exposed during deposition, the backside film is grown only on that portion, and thus the strain is rectified locally.

As shown above, the substrate 404 is loaded into the factory interface 503 of the cluster tool 500, the substrate is flipped so that the backside of the substrate is facing up, and the flipped substrate is transferred from the factory interface to the physical vapor deposition (PVD) chamber 400 to deposit the backside film layer on the backside of the substrate. The backside film layer is deposited using PVD, and the backside film layer is formed from sputtering from the sputter target 411.

The as-deposited SiN backside film layer has two times higher stress retention (~60-70%) than the backside film layer deposited by a CVD technique. The number of passes needed for backside deposition can be minimized due to high stress retention (thermal stability) of the backside film. The backside film layer deposited by PVD can provide radial uniform local stress without in-plane distortion issues, which would otherwise occur if the backside film layer were deposited by a CVD method. The transferring and deposition of the backside film layer is done by a non-contact approach (front side active region is not contacted), thereby eliminating the need of front side protection layer and associated processes such as removal/strip process and substrate bevel cleans. The system as contemplated allows for a wafer deposition rate of greater than 65 wafers per hour (WPH).

While the foregoing is directed to embodiments of the present disclosure, other and further embodiments of the present disclosure can be devised without departing from the basic scope thereof, and the scope thereof is determined by the claims that follow.

The invention claimed is:

1. A cluster tool for depositing a backside film layer on a backside of a substrate, comprising:
   a physical vapor deposition chamber having a chamber lid and one or more sidewalls, comprising:
      a processing region bounded at least partially by the chamber lid and the one or more sidewalls;
      a substrate support having a substrate supporting surface, the substrate supporting surface configured to support the substrate at or near a periphery of the substrate supporting surface without contacting an active region on a front side of the substrate;
      a shadow mask disposed above the substrate support, the shadow mask defining a deposition area on the backside of the substrate where the backside film layer is deposited;
      a gas conduit disposed in the sidewall of the physical vapor deposition chamber; and
      a magnetron, wherein the magnetron comprises:
         an inner pole comprising an inner plurality of magnets, the inner pole creating an inner magnetic field; and
         an outer pole disposed radially outward of and surrounding the inner pole, the outer pole comprising an outer plurality of magnets concentric with and separate from the inner plurality of magnets, the outer pole creating an outer magnetic field, wherein a strength of the outer magnetic field is different from a strength of the inner magnetic field.

2. The cluster tool of claim 1, further comprising a sputter target, wherein the sputter target comprises silicon, and the gas conduit is in fluid communication with a gas source, wherein the gas source supplies a process gas to the sputter target, the process gas comprising a nitrogen-containing gas.

3. The cluster tool of claim 1, further comprising a power source configured to deliver DC power to a sputter target at a voltage of about 2000 V to about 60000 V, a time duration of about 10 μs and about 40 μs, and a pulse cycle time of about 200 μs.

4. The cluster tool of claim 1, wherein a power source is configured to apply an RF bias to the substrate support.

5. The cluster tool of claim 1, further comprising a factory interface, wherein the substrate support is configured to receive the substrate from the factory interface.

6. The cluster tool of claim 5, wherein the factory interface comprises a flipper configured to hold and flip the substrate without contacting the active region of the front side of the substrate.

7. The cluster tool of claim 1, wherein:
the inner pole and the outer pole form a closed-loop magnetron assembly,
wherein a ratio of the magnetic field strength of the inner magnetic field to the outer magnetic field is 0.5 to 0.73.

8. The cluster tool of claim 6, wherein the flipper is configured to contact only an edge exclusion area of the substrate, the edge exclusion area measuring from an edge of the substrate to a radially inward distance of about 1 mm to about 5 mm.

9. The cluster tool of claim 8, wherein the radially inward distance is about 1 mm to about 2 mm.

10. The cluster tool of claim 8, wherein the flipper comprises a blade and arms extending from the blade.

11. The cluster tool of claim 10, wherein each arm of the blade comprises a clamping spring disposed on a distal end of each arm.

12. The cluster tool of claim 11, wherein the blade further comprises a vertical wall coupled to the clamping spring and configured to contact an edge of the substrate.

13. The cluster tool of claim 11, further comprising a contact pad coupled to the clamping spring, the contact pad configured to contact an edge exclusion area of the substrate.

14. The cluster tool of claim 1, wherein the physical vapor deposition chamber further comprises a flipper configured to hold and flip the substrate without contacting the active region of the front side of the substrate.

15. The cluster tool of claim 1, further comprising a direct current (DC) power source.

16. The cluster tool of claim 15, wherein the DC power source is configured to supply a pulsed DC voltage to a sputter target.

17. The cluster tool of claim 16, wherein the sputter target is a dielectric sputter target.

18. The cluster tool of claim 17, wherein the sputter target is a silicon sputter target.

19. The cluster tool of claim 16, wherein the power source further supplies an alternating current (AC) power to the sputter target, wherein a ratio of RF power level to DC power level is from about 2:1 to about 8:1.

20. The cluster tool of claim 1, wherein the substrate support comprises one or more lamps configured to anneal the substrate to about 750° C. to about 950° C.

* * * * *